(12) United States Patent
Masumoto et al.

(10) Patent No.: US 9,129,920 B2
(45) Date of Patent: Sep. 8, 2015

(54) DISPLAY PANEL AND DISPLAY DEVICE

(75) Inventors: Kenichi Masumoto, Hyogo (JP);
Hiroyuki Yamakita, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/131,440

(22) PCT Filed: Jul. 22, 2011

(86) PCT No.: PCT/JP2011/004157
§ 371 (c)(1),
(2), (4) Date: Jan. 8, 2014

(87) PCT Pub. No.: WO2013/014700
PCT Pub. Date: Jan. 31, 2013

(65) Prior Publication Data
US 2014/0131693 A1      May 15, 2014

(51) Int. Cl.
*H01L 27/32* (2006.01)
*G09F 9/00* (2006.01)
*G09F 9/30* (2006.01)
*H01L 51/52* (2006.01)

(52) U.S. Cl.
CPC .............. *H01L 27/3244* (2013.01); *G09F 9/00* (2013.01); *G09F 9/30* (2013.01); *H01L 51/529* (2013.01)

(58) Field of Classification Search
CPC .................................................... H01L 51/529
See application file for complete search history.

(56) References Cited

U.S. PATENT DOCUMENTS

2010/0156763 A1* 6/2010 Lee et al. ................ 345/76
2010/0244005 A1* 9/2010 Gyoda ..................... 257/40

OTHER PUBLICATIONS

Smalc et al., "Thermal performance of natural graphite heat spreaders," Proceedings of IPACK2005, ASME InterPACK '05, pp. 1-10.*
Smalc et al., "Thermal performance of natural graphite heat spreaders," Proceedings of IPACK2005, ASME InterPACK '05, pp. 1-10, Jul. 17-22, 2005.*

* cited by examiner

*Primary Examiner* — Allen Parker
*Assistant Examiner* — Xia L Cross
(74) *Attorney, Agent, or Firm* — Greenblum & Bernstein, P.L.C.

(57) ABSTRACT

The present application discloses a display panel including flexible substrates on which first power lines are mounted to supply power; a substrate including a first surface provided with a display area, a second surface opposite to the first surface, and second power lines for connecting the first power lines to the display pixels; a thermal conduction member partially covering the second surface and conducting heat in an in-plane direction; and a thermal conduction seal covering a periphery of the thermal conduction member. The first surface includes an arrangement area to arrange the second power lines between the flexible substrates and the display area. The second surface includes a first area opposite to the display area and a second area opposite to the arrangement area. The thermal conduction member covers at least the first area. The thermal conduction seal covers the second area.

6 Claims, 14 Drawing Sheets

FIG. 8
SECTION (a)
| 0.0 | 0.0 | 0.0 | 0.7 | 0.0 | 0.0 | 0.0 | 0.0 | 0.7 | 0.0 | 0.0 | 0.0 |
|---|---|---|---|---|---|---|---|---|---|---|---|
| 0.0 | 0.0 | 0.0 | 0.0 | 0.0 | 0.0 | 0.0 | 0.0 | 0.0 | 0.0 | 0.0 | 0.0 |
| 0.0 | 0.0 | 0.0 | 0.0 | 0.0 | 0.0 | 0.0 | 0.0 | 0.0 | 0.0 | 0.0 | 0.0 |
| 0.0 | 0.0 | 0.0 | 0.5 | 0.5 | 0.5 | 0.5 | 0.5 | 0.5 | 0.0 | 0.0 | 0.0 |
| 0.0 | 0.0 | 0.0 | 0.5 | 0.5 | 0.5 | 0.5 | 0.5 | 0.5 | 0.0 | 0.0 | 0.0 |
| 0.0 | 0.0 | 0.0 | 0.5 | 0.5 | 0.5 | 0.5 | 0.5 | 0.5 | 0.0 | 0.0 | 0.0 |
| 0.0 | 0.0 | 0.0 | 0.5 | 0.5 | 0.5 | 0.5 | 0.5 | 0.5 | 0.0 | 0.0 | 0.0 |
| 0.0 | 0.0 | 0.0 | 0.5 | 0.5 | 0.5 | 0.5 | 0.5 | 0.5 | 0.0 | 0.0 | 0.0 |
| 0.0 | 0.0 | 0.0 | 0.5 | 0.5 | 0.5 | 0.5 | 0.5 | 0.5 | 0.0 | 0.0 | 0.0 |
| 0.0 | 0.0 | 0.0 | 0.0 | 0.0 | 0.0 | 0.0 | 0.0 | 0.0 | 0.0 | 0.0 | 0.0 |
| 0.0 | 0.0 | 0.0 | 0.0 | 0.0 | 0.0 | 0.0 | 0.0 | 0.0 | 0.0 | 0.0 | 0.0 |
| 0.0 | 0.0 | 0.0 | 0.7 | 0.0 | 0.0 | 0.0 | 0.0 | 0.7 | 0.0 | 0.0 | 0.0 |
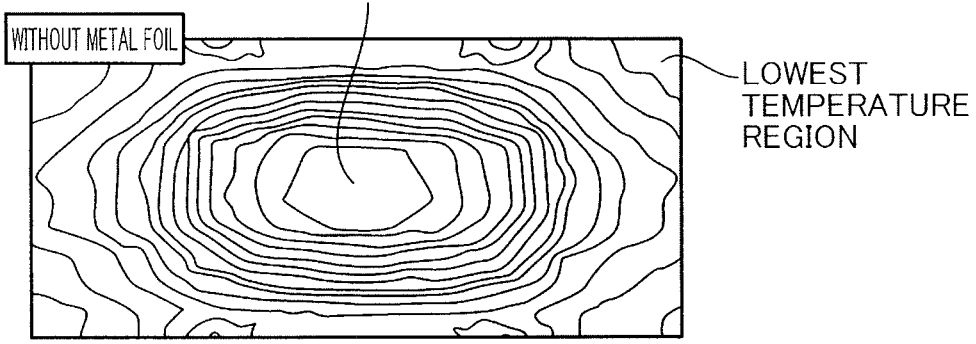
SECTION (b) — WITHOUT METAL FOIL — HIGHEST TEMPERATURE REGION — LOWEST TEMPERATURE REGION
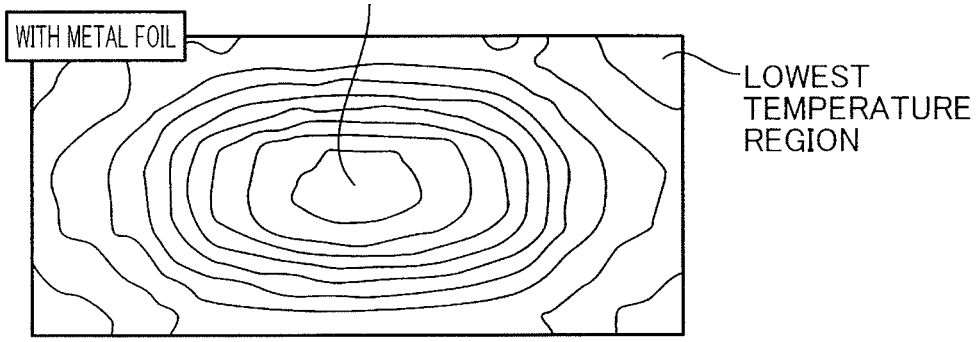
SECTION (c) — WITH METAL FOIL — HIGHEST TEMPERATURE REGION — LOWEST TEMPERATURE REGION

FIG. 9
SECTION (a)
| 0.0 | 0.7 | 0.0 | 0.7 | 0.0 | 0.0 | 0.0 | 0.0 | 0.7 | 0.0 | 0.7 | 0.0 |
|---|---|---|---|---|---|---|---|---|---|---|---|
| 0.0 | 0.0 | 0.0 | 0.0 | 0.0 | 0.0 | 0.0 | 0.0 | 0.0 | 0.0 | 0.0 | 0.0 |
| 0.0 | 0.0 | 0.0 | 0.0 | 0.0 | 0.0 | 0.0 | 0.0 | 0.0 | 0.0 | 0.0 | 0.0 |
| 0.7 | 0.0 | 0.0 | 0.5 | 0.5 | 0.5 | 0.5 | 0.5 | 0.5 | 0.0 | 0.0 | 0.7 |
| 0.0 | 0.0 | 0.0 | 0.5 | 0.5 | 0.5 | 0.5 | 0.5 | 0.5 | 0.0 | 0.0 | 0.0 |
| 0.0 | 0.0 | 0.0 | 0.5 | 0.5 | 0.5 | 0.5 | 0.5 | 0.5 | 0.0 | 0.0 | 0.0 |
| 0.0 | 0.0 | 0.0 | 0.5 | 0.5 | 0.5 | 0.5 | 0.5 | 0.5 | 0.0 | 0.0 | 0.0 |
| 0.0 | 0.0 | 0.0 | 0.5 | 0.5 | 0.5 | 0.5 | 0.5 | 0.5 | 0.0 | 0.0 | 0.0 |
| 0.7 | 0.0 | 0.0 | 0.5 | 0.5 | 0.5 | 0.5 | 0.5 | 0.5 | 0.0 | 0.0 | 0.7 |
| 0.0 | 0.0 | 0.0 | 0.0 | 0.0 | 0.0 | 0.0 | 0.0 | 0.0 | 0.0 | 0.0 | 0.0 |
| 0.0 | 0.0 | 0.0 | 0.0 | 0.0 | 0.0 | 0.0 | 0.0 | 0.0 | 0.0 | 0.0 | 0.0 |
| 0.0 | 0.7 | 0.0 | 0.7 | 0.0 | 0.0 | 0.0 | 0.0 | 0.7 | 0.0 | 0.7 | 0.0 |
SECTION (b)
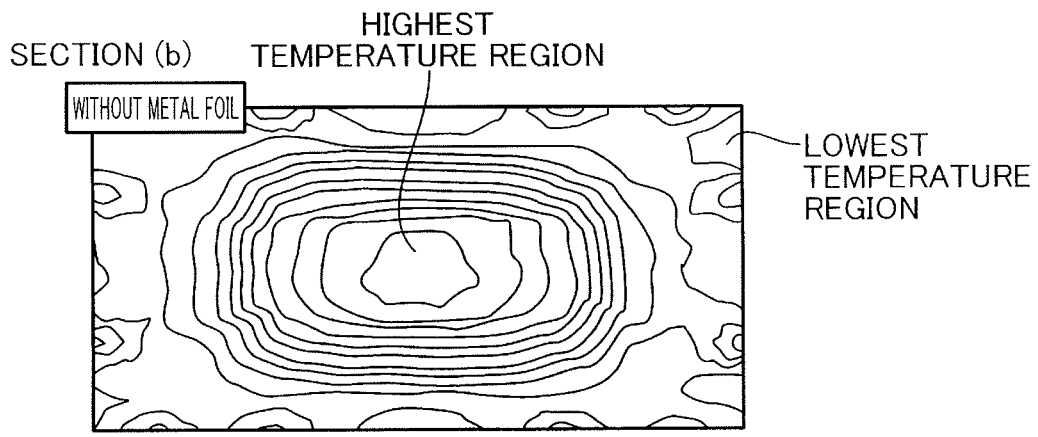
SECTION (c)
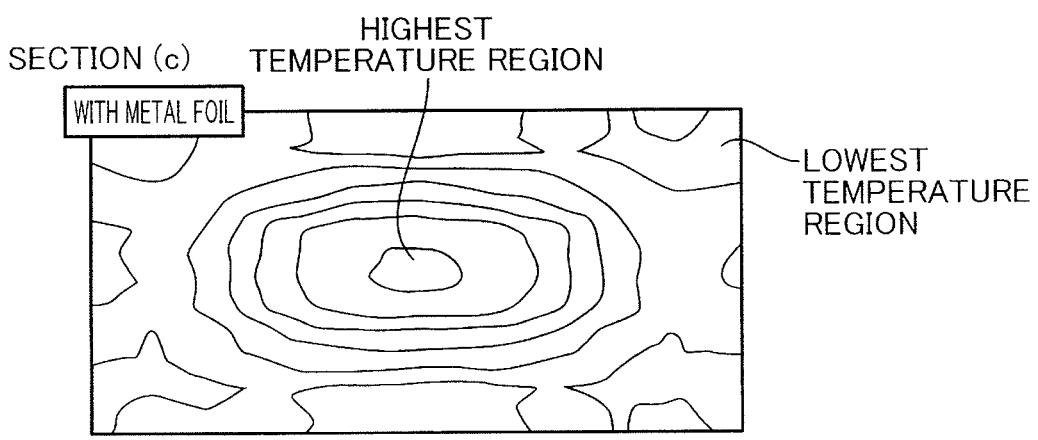

DISPLAY PANEL AND DISPLAY DEVICE

TECHNICAL FIELD

The present invention relates to a display panel for displaying images and a display device equipped with the display panel.

BACKGROUND ART

A display panel causes light emission from pixels to display images. The display panel generates heat under the light emission from the pixels. Various radiators have been developed to facilitate heat dissipation from display panels.

Patent Documents 1 and 2 disclose radiators formed from graphite sheets. Each of Patent Documents 1 and 2 attempts to use a graphite sheet covered with another sheet material which prevents graphite powder from dropping off from the graphite sheet.

A graphite sheet has excellent heat conductivity in the in-plane direction. Therefore, the graphite sheet may be used as a suitable material to facilitate thermal dissipation from an area in which there is heat generation.

FIG. 13 is a schematic view showing effects of a radiator on images displayed on a display panel 900 which uses organic EL (electroluminescence) elements (organic EL display panel).

The display panel 900 shown in the section (a) of FIG. 13 displays a locally bright image. The rectangular area at the center of the display panel 900 is a high brightness area 901 in which a high brightness image is displayed whereas the outer area surrounding the high brightness area 901 is a low brightness area 902 in which a low brightness image is displayed. The high brightness area 901 generates a lot of heat.

The section (b) of FIG. 13 shows an image determined by video signals subsequently transmitted to the display panel 900. The video signals determine an evenly bright image. Brightness of the image determined by the video signals is slightly lower than the brightness of the high brightness area 901.

The section (c) of FIG. 13 shows an image actually displayed on the display panel 900 without a radiator. Heat generation in the high brightness area 901 causes a difference in luminous efficiency between organic EL elements situated in the high and low brightness areas 901, 902. Accordingly, an afterglow area 903 substantially in correspondence to the high brightness area 901 appears in the image.

The section (d) of FIG. 13 shows an image actually displayed on the display panel 900 with a radiator. Since the radiator radiates heat generated in the high brightness area 901, the difference in luminous efficiency of the organic EL elements is decreased between the high and low brightness areas 901, 902. Therefore, there may be a decreased area size of the afterimage area 903. Thus, preceding image display becomes influential to the display panel 900. Therefore, it is important to mount a radiator on the display panel and decrease heat generation.

The present inventor also figured out that a display panel has heat sources other than the display area to display images.

FIG. 14 is a schematic plan view of a substrate 910 of a display panel. The heat sources other than the display area are described with reference to FIG. 14.

An external substrate (not shown) is mounted on the substrate 910 to supply power to the substrate 910. In FIG. 14, the external substrate is mounted on the rectangular area MA indicated by the dotted line. An electrode 911 is situated in the rectangular area MA to supply power to the substrate 910.

An electrode 913 is arranged in correspondence to the electrode 911 in the rectangular area MA. The electrode 913 is situated on a power supply zone 914 to supply power to a display area. The electrode 913 is narrower than the electrode 911 in the rectangular area MA. This means that a power line 915 connecting the electrodes 911, 913 tapers toward the electrode 913.

The graph above the plan view of the substrate 910 schematically shows a change in resistance value between the electrodes 911, 913. Because of the power line 915 which gradually becomes narrower, the resistance value reaches a peak at the boundary between the power line 915 and the electrode 913. Accordingly, there is large heat generation at the boundary between the power line 915 and the electrode 913. This heat is transferred to the electrode 913 through the power line 915. There is great contact resistance between the electrode 913 and the power supply zone 914. Because of this contact resistance, heat is also generated in a contact area of the electrode 913 on the power supply zone 914.

FIG. 15 is a schematic plan view of a substrate 920 of a display panel. The heat sources other than the display area are further described with reference to FIG. 15.

An external substrate (not shown) is mounted on the substrate 920 to supply power to the substrate 920. In FIG. 15, the external substrate is mounted on the rectangular area MA indicated by the dotted line. An electrode 921 is arranged in the rectangular area MA to supply power to the substrate 920.

An electrode 923 is arranged in correspondence to the electrode 921 in the rectangular area MA. The electrode 923 is situated on a power supply zone 924 to supply power to a display area. The electrode 921 is narrower in the rectangular area MA than the electrode 923 is. This means that the power line 925, which connects the electrodes 921, 923, tapers toward the electrode 921.

The graph above the plan view of the substrate 920 schematically shows a change in resistance value between the electrodes 921, 923. Because of the power line 925 which gradually becomes narrower, the resistance value reaches a peak at the boundary between the power line 925 and the electrode 921. Accordingly, there is large heat generation at the boundary between the power line 925 and the electrode 921. This heat is transferred to the electrode 923 through the power line 925. Like the configuration in FIG. 14, because of this contact resistance generated between the electrode 923 and the power supply zone 924, there is heat generation in the contact area between the electrode 923 and the power supply zone 924.

If heat generated on the power supply path is transferred to the radiator, the radiator conducts the heat to the display area which displays images. Accordingly, luminous efficiency of luminous elements in the display area fluctuates because of the heat generation on the power supply path.

Patent Document 1: JP 2005-210035 A
Patent Document 2: JP 2008-80672 A

SUMMARY OF THE INVENTION

It is an object of the present invention to provide a display panel having a structure to make heat generation on the power supply path less influential to a display area which displays images, and a display device equipped with the display panel.

A display panel-according to one aspect of the present invention includes: flexible substrates on which first power lines are mounted to supply power; a substrate including a first surface provided with a display area, which has display pixels arranged to display images, a second surface opposite to the first surface, and second power lines configured to connect the first power lines to the display pixels; a thermal conduction member configured to partially cover the second surface and conduct heat in an in-plane direction; and a thermal conduction seal configured to cover a periphery of the thermal conduction member. The first surface includes an arrangement area to arrange the second power lines between the flexible substrates and the display area. The second surface includes a first area opposite to the display area and a second area opposite to the arrangement area. The thermal conduction member covers at least the first area. The thermal conduction seal covers the second area.

A display device according to another aspect of the present invention includes: the aforementioned display panel; a housing configured to store the display panel; and a heat sink connected to the thermal conduction seal. The heat sink is used as a chassis to fix the display panel to the housing.

The display panel and the display device may make heat generation on the power supply path less influential to the display area which displays images.

The objects, features and advantages of the present invention will become more apparent upon reading the following detailed description along with the accompanying drawings.

BRIEF DESCRIPTION OF THE DRAWINGS

FIG. 8 shows a simulation result about a temperature distribution of the display panel.

FIG. 9 shows a simulation result about a temperature distribution of the display panel.

DETAILED DESCRIPTION

Figure 1:
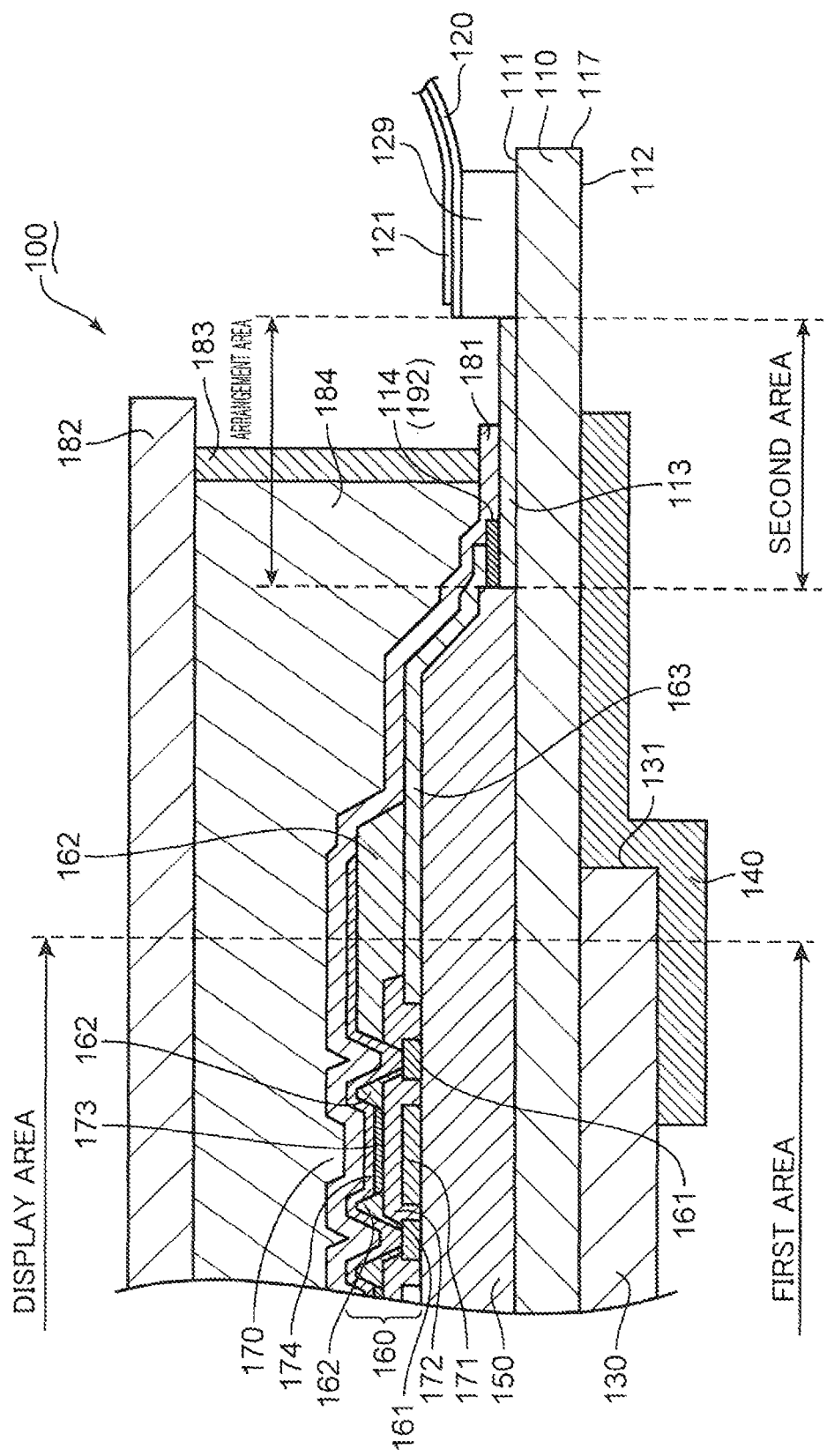
FIG. 1 is a schematic partial cross-sectional view of a display panel according to the first embodiment.

Display panels and display devices are described with reference to the drawings. In the following embodiments, the same components are denoted with the same reference symbols. To simplify the description, redundant explanation is omitted as appropriate. Configurations, arrangements and shapes shown in the drawings, and description about the drawings are merely intended to make principles of the display panel and the display device easily understood. Therefore, the principles of the display panel and the display device are not restricted thereby in any way.

First Embodiment

Structure of Display Panel

Figure 2:
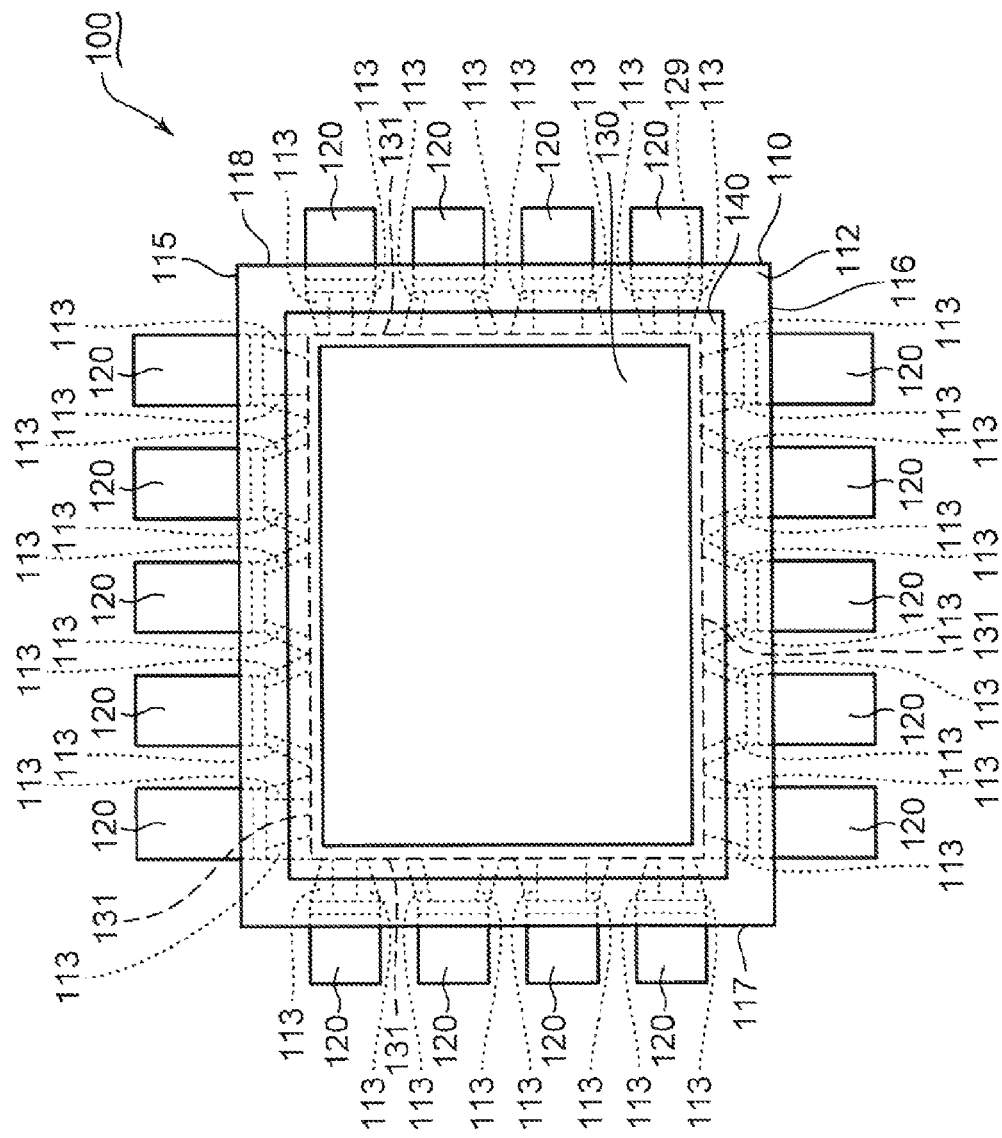
FIG. 2 is a schematic rear view of the display panel shown in FIG. 1.
Figure 3:
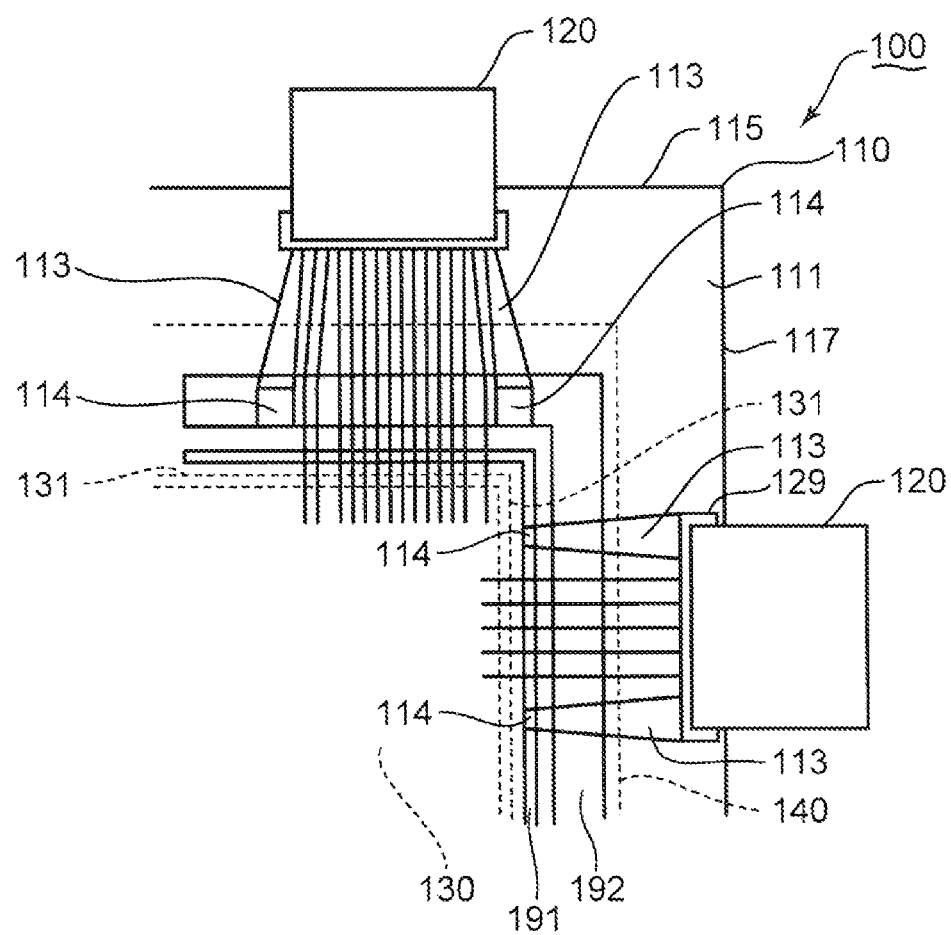
FIG. 3 is a schematic partial front view of the display panel shown in FIG. 1.

FIG. 1 is a schematic partial cross-sectional view of the display panel 100 according to the first embodiment. FIG. 2 is a schematic rear view of the display panel 100. FIG. 3 is a schematic partial front view of the display panel 100. The display panel 100 is described with reference to FIGS. 1 to 3. An organic EL display panel is described as the display panel 100. Alternatively, a plasma display panel or another device for displaying images may be used as the display panel.

The display panel 100 includes a substrate 110 on which various elements (described later) are mounted to display images. The substrate 110 includes a first principal surface 111, on which there is a display area to display images, and a second principal surface 112 opposite to the first principal surface 111. In this embodiment, the first surface is exemplified by the first principal surface 111. The second surface is exemplified by the second principal surface 112.

The display panel 100 further includes a terminal portion 129 formed on the first principal surface 111 and several flexible substrates 120 mounted on the terminal portion 129. Each of the flexible substrates 120 includes a first power line 121 (c.f. FIG. 1). Power is supplied to display images through the first power lines 121 (c.f. FIG. 1) mounted on the flexible substrates 120. The flexible substrates 120 are arranged along with the top edge 115, the bottom edge 116 (c.f. FIG. 2), the right edge 117 and the left edge 118 (c.f. FIG. 2) of the substrate 110 at intervals (c.f. FIG. 2).

The display panel 100 further includes a graphite sheet 130 which partially covers the second principal surface 112 of the substrate 110. The graphite sheet 130 conducts heat generated in the display area in the in-plane direction. In this embodiment, the thermal conduction member is exemplified by the graphite sheet 130. Other materials having high thermal conductivity in the in-plane direction may be used as the thermal conduction member.

The second principal surface 112 of the substrate 110 includes a first area opposite to the display area. The graphite sheet 130 covers the entire first area. Since the graphite sheet 130 is larger than the first area, there is the periphery 131 of the graphite sheet 130 beyond the first area.

The display panel 100 further includes a metal foil sheet 140, which covers the periphery 131 of the graphite sheet 130. Unlike the graphite sheet 130 with high thermal conductivity in the in-plane direction, the metal foil sheet 140 has isotropic thermal conduction characteristics. For example, the metal foil sheet 140 may be an aluminum sheet or a copper sheet. The metal foil sheet 140 is adhered to the graphite sheet 130 and the second principal surface 112. In this embodiment, the thermal conduction seal is exemplified by the metal foil sheet 140. Another seal material with high thermal conductivity may be used as the thermal conduction seal.

Time degradation is likely to cause graphite powder dropping from the graphite sheet 130, in particular, at the periphery 131. In this embodiment, graphite powder is less likely to drop since the metal foil sheet 140 covers the periphery 131. Therefore, there is a low risk of failures such as resultant short circuit from the dropping graphite powder.

The display panel 100 further includes a TFT layer 150 formed on the first principal surface 111 and an EL layer 160 which is laminated onto the TFT layer 150. Organic EL elements 170 are formed on the EL layer 160. The TFT layer 150 drives the organic EL elements 170. Accordingly, the organic EL elements 170 emit light.

For example, each of the organic EL elements 170, which are arranged in a matrix in the display area so as to display images, is used as a display pixel. The display panel 100 may display images in response to video signals as a result of emission from the organic EL elements 170.

The organic EL element 170 includes a bottom electrode 171 formed on the TFT layer 150, a hole injection layer 172 for trapping the holes from the bottom electrode 171, an organic luminous layer 173, which emits light due to a combined hole with electron, and a cathode electrode 174 situated on the organic luminous layer 173. Under voltage application between the bottom electrode 171 and the cathode electrode 174, electric current flows into the organic luminous layer 173, so that the organic luminous layer 173 emits light.

The EL layer 160 includes auxiliary electrodes 161 in addition to the organic EL elements 170. The auxiliary electrodes 161 are used for suppressing a drop of voltage applied to the cathode electrode 174. The EL layer 160 further includes a bank 162 which surrounds the organic EL elements 170. The bank 162 defines an area of the organic luminous layer.

The EL layer 160 further includes a power supply line 163 (c.f. FIG. 1) which extends from the display area to the flexible substrate 120. The substrate 110 further includes a second power line 113 which is electrically connected to the first power line 121 (c.f. FIG. 1). The power supply line 163 (c.f. FIG. 1) extends along the TFT layer 150. The second power line 113 is formed on the same layer as the TFT layer 150, and electrically connected to the power supply line 163 (c.f. FIG. 1) via a connection portion 114 (portion of a power supply zone 192 (described later), to which the second power line 113 and the power supply line 163 (c.f. FIG. 1) are connected). Accordingly, the first power line 121 (c.f. FIG. 1) is electrically connected to the organic EL element 170, which forms a display pixel, via the second power line 113 and the power supply line 163 (c.f. FIG. 1). Therefore, power is supplied from the first power line 121 (c.f. FIG. 1) to the organic EL element 170. In this embodiment, the power supply portion is exemplified by the power supply line 163 (c.f. FIG. 1).

In the following description, the area of the first principal surface 111 on which the second power lines 113 are arranged between the flexible substrates 120 and the display area is called "arrangement area". The area of the second principal surface 112 opposite to the arrangement area is called "second area".

The metal foil sheet 140 partially covers the second area. Alternatively, the metal foil sheet may cover the entire second area.

The thermal conduction member (e.g. graphite sheet 130) covers at least the first area. Therefore, heat generated in the display area is conducted in the in-plane direction via the thermal conduction member, and then is appropriately radiated. Since the thermal conduction seal (e.g. metal foil sheet 140) covers the second area, heat generated in the arrangement area is appropriately radiated via the thermal conduction seal, which results in little thermal conduction to the first area. Therefore, heat generated on the power supply path to the display area is less likely to be conducted to the display pixels in the display area, so that the heat may become less influential.

Figure 14:
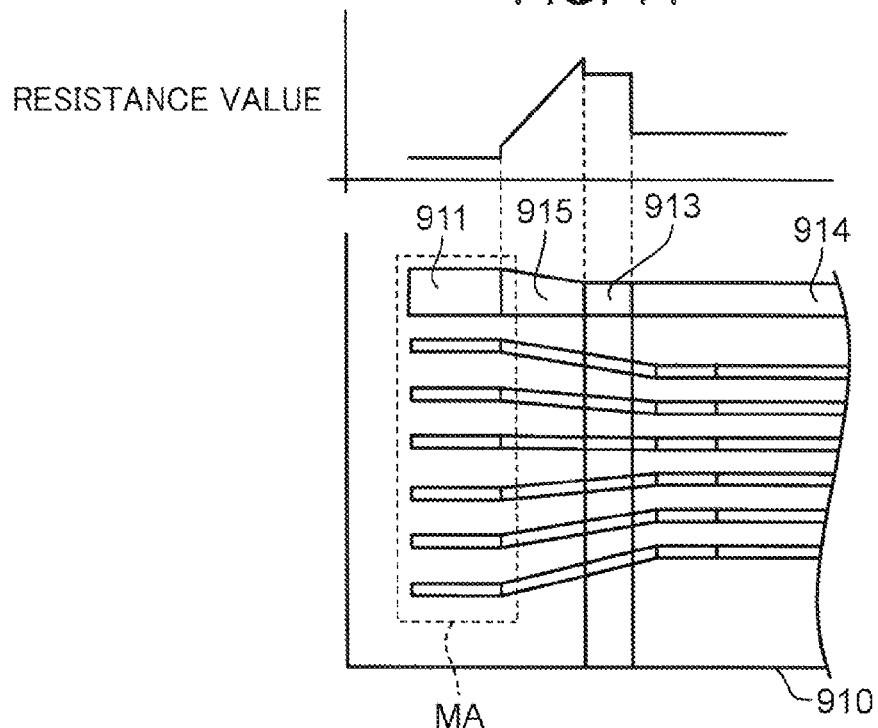
FIG. 14 is a schematic plan view of a substrate of a display panel.
Figure 15:
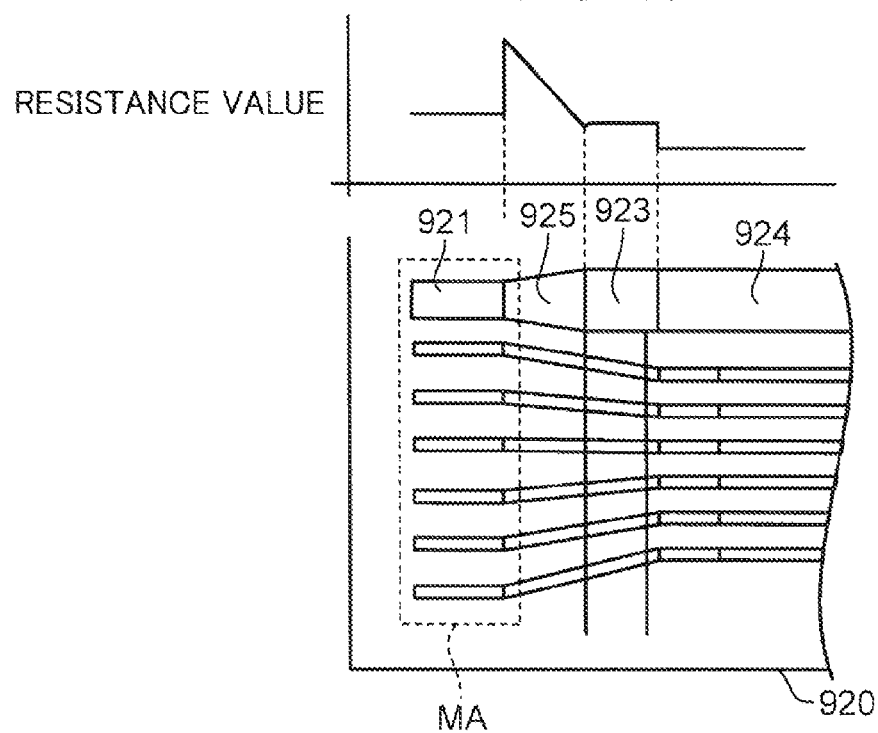
FIG. 15 is a schematic plan view of a substrate of a display panel.

As described with reference to FIGS. 14 and 15, a lot of heat is likely to happen to the connection portion 114 between the second power line 113 and the power supply line 163 (c.f. FIG. 1) because of an increased resistance value of the connection portion 114. The metal foil sheet 140 particularly contributes to radiating heat generated in the connection portion 114.

Power supply zones 191, 192 for supplying power to the display area are formed on the substrate 110. The connection portion 114 between the power supply line 163 (c.f. FIG. 1) and the second power line 113, which is connected to the first power line 121 (c.f. FIG. 1) of each of the flexible substrates 120 arranged along the right and left edges 117, 118 (c.f. FIG. 2), is situated on the inner power supply zone 191. The connection portion 114 between the power supply line 163 (c.f. FIG. 1) and the second power line 113, which is connected to the first power line 121 (c.f. FIG. 1) of each of the flexible substrates 120 arranged along the top and bottom edges 115, 116 (c.f. FIG. 2), is situated on the outer power supply zone 192.

As shown in FIG. 1, the display panel 100 includes a sealing thin film 181, which covers the EL layer 160, a sealing substrate 182, which faces the substrate 110, a seal member 183, which seals between the sealing substrate 182 and the substrate 110, and a sealing portion 184 formed by resin encapsulated in a space surrounded by the sealing thin film 181, the sealing substrate 182 and the seal member 183. The sealing thin film 181, the seal member 183 and the sealing portion 184 prevents air from entering the space between the sealing substrate 182 and the substrate 110. Accordingly, the EL layer 160 is less likely to be degraded.

Figure 4:
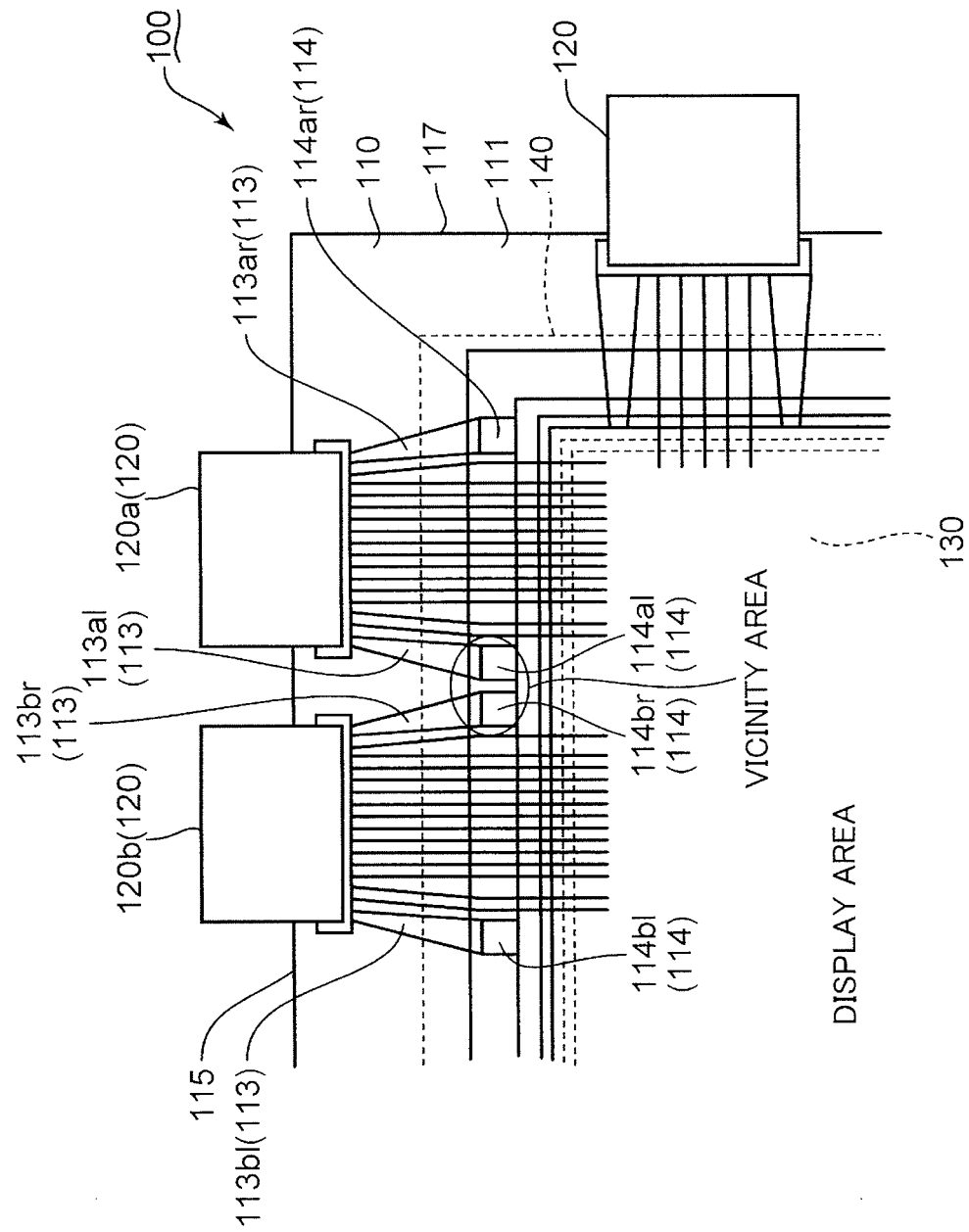
FIG. 4 is a schematic partial front view of the display panel shown in FIG. 1.
Figure 5:
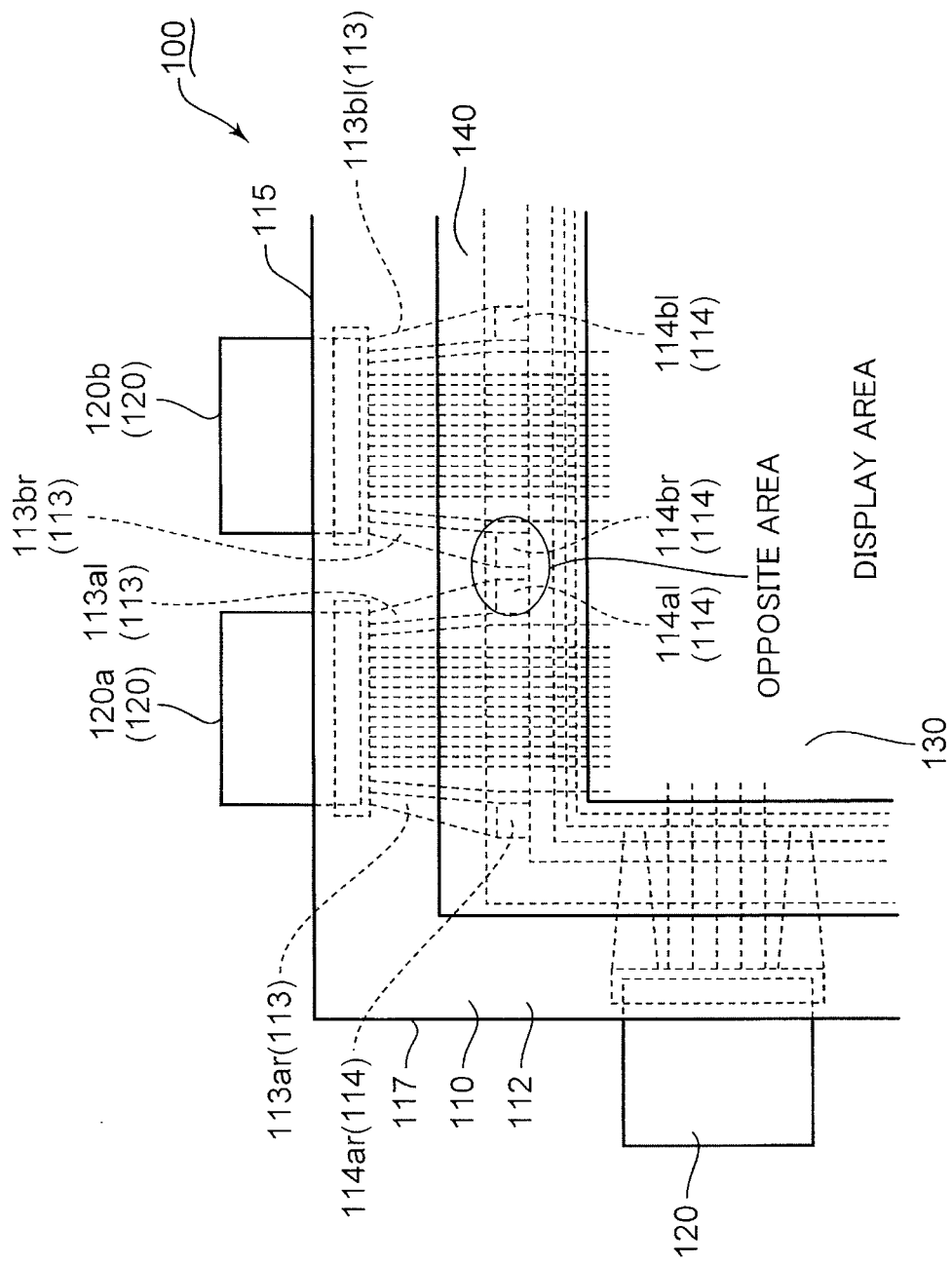
FIG. 5 is a partial rear view in correspondence to FIG. 4.

FIG. 4 is a schematic partial front view of the display panel 100. FIG. 5 is a partial rear view corresponding to FIG. 4. The display panel 100 is further described with reference to FIGS. 1, 4 and 5.

FIGS. 4 and 5 show one flexible substrate 120 situated along the right edge 117 of the substrate 110, and two flexible substrates 120 situated along the top edge 115 of the substrate 110. One of the two flexible substrates 120 situated along the top edge 115 is denoted with the reference symbol "120a" whereas the other is denoted with reference symbol "120b". The flexible substrates 120a, 120b are described.

The flexible substrate 120b attached to the first principal surface 111 of the substrate 110 is distant from the flexible substrate 120a attached to the first principal surface 111 near the corner of the substrate 110 by a predetermined interval. In this embodiment, the first flexible substrate is exemplified by one of the flexible substrates 120a, 120b. The second flexible substrate is exemplified by the other.

FIGS. 4 and 5 show a pair of second power lines 113, each of which is connected to the first power lines 121 (c.f. FIG. 1) mounted on the flexible substrate 120a. The left second power line 113 is denoted with the reference symbol "113al" whereas the right second power line 113 is denoted with the reference symbol "113ar". The connection portion 114 corresponding to the second power line 113al is denoted with the reference symbol "114al" whereas the connection portion 114 corresponding to the second power line 113ar is denoted with the reference symbol "114ar".

FIGS. 4 and 5 show a pair of second power lines 113, each of which is connected to the first power lines 121 (c.f. FIG. 1) mounted on the flexible substrate 120b. The left second power line 113 is denoted with the reference symbol "113bl" whereas the right second power line 113 is denoted with the reference symbol "113br". The connection portion 114 corresponding to the second power line 113bl is denoted with the reference symbol "114bl" whereas the connection portion 114 corresponding to the second power line 113br is denoted with the reference symbol "114br".

As described above, the area covered by the graphite sheet 130 corresponds to the display area. There is a relatively short distance between the connection portions 114*al*, 114*br*. Therefore, an interval between the second power lines 113*al*, 113*br* gradually decreases with getting closer to the display area, and becomes shortest at the connection portions 114*al*, 114*br*.

In the following description, the connection portions 114*al*, 114*br* and their peripheral areas are called "vicinity area". The area on the second principal surface 112 opposite to the vicinity area is called "opposite area".

As described with reference to FIGS. 14 and 15, a lot of heat is likely to happen to an area around the connection portion 114 between the power supply line 163 (c.f. FIG. 1) and the second power line 113 because of an increased resistance value in the connection portion 114. Therefore, heat is likely to be accumulated in the vicinity area in which the two connection portions 114*al*, 114*br* are close to each other. However, the opposite area opposite to the vicinity area is covered with the metal foil sheet 140, so that the heat generated in the vicinity area is radiated via the metal foil sheet 140. Consequently, the heat in the vicinity area becomes less influential to images displayed in the display area.

(Method for Manufacturing Display Panel)

Figure 6:
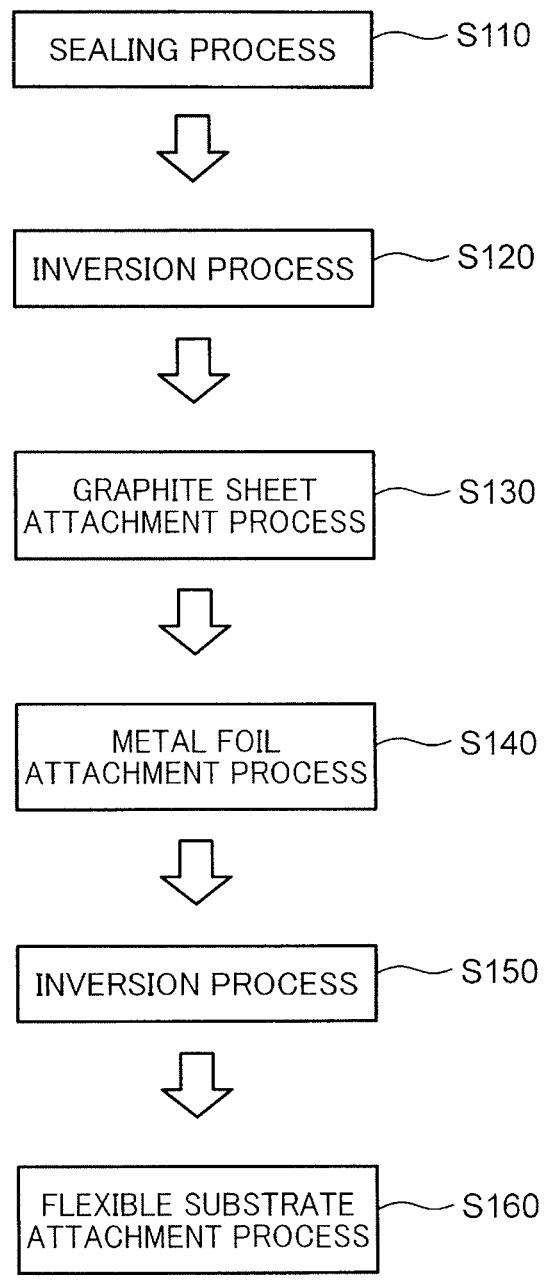
FIG. 6 is a flow chart showing a method for manufacturing the display panel depicted in FIG. 1.
Figure 7:
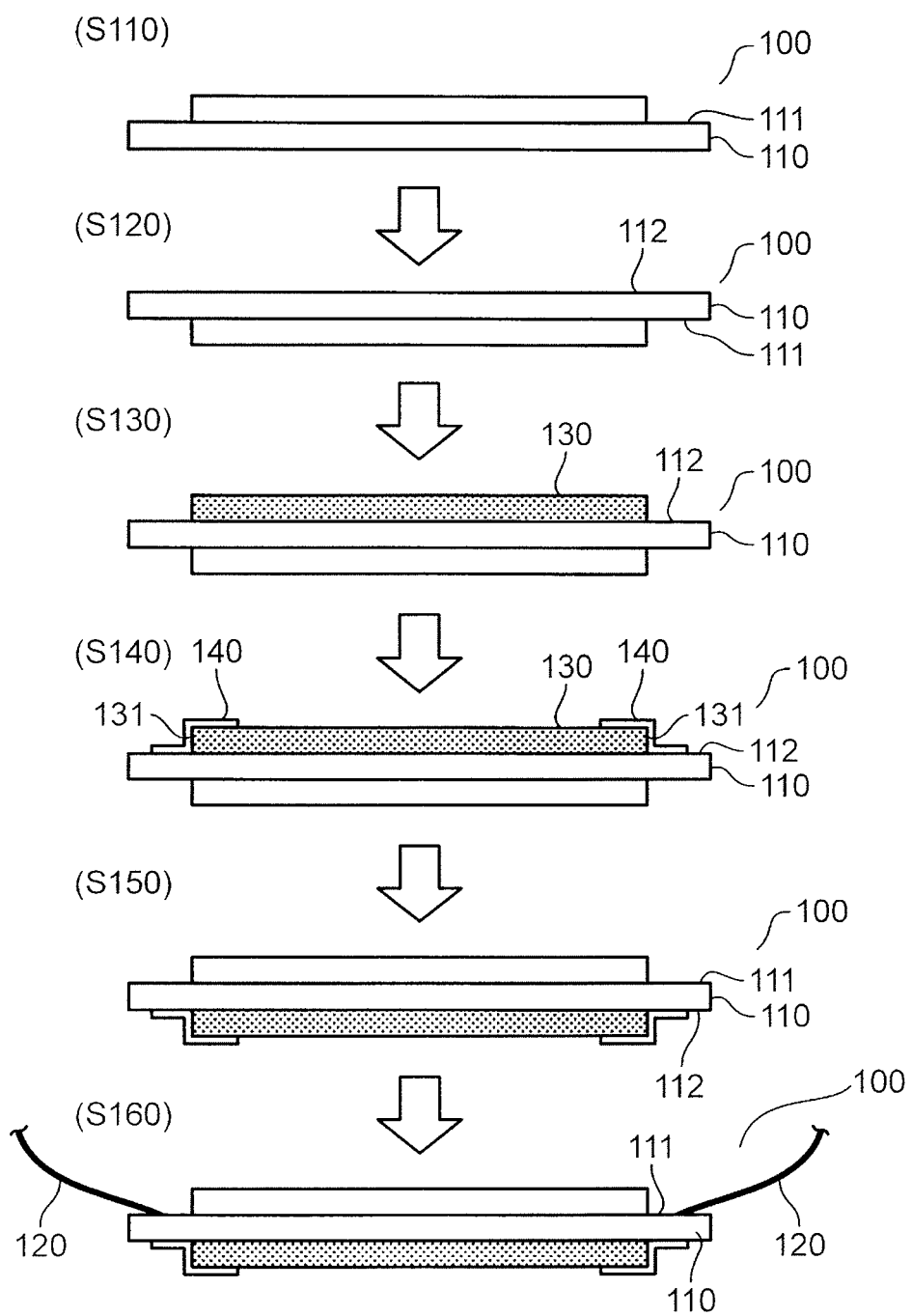
FIG. 7 is a schematic view showing the display panel in each step of the method for manufacturing the display panel shown in FIG. 6.

FIG. 6 is a flow chart showing a method for manufacturing the display panel 100. FIG. 7 is a schematic view showing the display panel 100 in each step shown in FIG. 6. The method for manufacturing the display panel 100 is described with reference to FIGS. 1, 6 and 7.

(Step S110)

A sealing process is executed in step S110. In the sealing process, the substrate 110 is set so that the first principal surface 111 of the substrate 110 faces up. The sealing thin film 181, the sealing substrate 182, the seal member 183 and the sealing portion 184 are placed and formed after the TFT layer 150 and the EL layer 160 are formed on the first principal surface 111 of the substrate 110. Step S120 is executed after completion of the sealing process.

(Step S120)

In step S120, the substrate 110 is vertically inverted. Accordingly, the first principal surface 111 faces down whereas the second principal surface 112 faces up. Step S130 is then executed.

(Step S130)

In step S130, the graphite sheet 130 is attached to the second principal surface 112 of the substrate 110. The graphite sheet 130 may be bonded onto the second principal surface 112 using adhesive. Step S140 is executed after the graphite sheet 130 is fixed on the second principal surface 112.

(Step S140)

In step S140, the metal foil sheet 140 is attached to the graphite sheet 130 and the second principal surface 112 of the substrate 110. Accordingly, the metal foil sheet 140 covers the periphery 131 of the graphite sheet 130. It is preferable to use adhesive for bonding the metal foil sheet 140 with the graphite sheet 130 and the second principal surface 112. Step S150 is executed after the metal foil sheet 140 is attached to the graphite sheet 130 and the second principal surface 112.

(Step S150)

In step S150, the substrate 110 is vertically inverted. Accordingly, the first principal surface 111 faces up whereas the second principal surface 112 faces down. Step S160 is then executed.

(Step S160)

In step S160, the flexible substrate 120 is attached to the first principal surface 111 of the substrate 110. Accordingly, the first and second power lines 121, 113 are electrically connected (c.f. FIG. 1).

(Temperature Distribution)

FIGS. 8 and 9 show simulation results about a temperature distribution of the display panel. Effects of the metal foil sheet are described with reference to FIGS. 8 and 9.

The section (a) of FIG. 8 shows temperature setting data used for the simulation. The temperature setting data in FIG. 8 simulates that a very bright image is displayed in the center area of the display panel. The numeric values "0.5" are assigned as the temperature data on an area in which the very bright image is displayed.

In the simulation model shown in the section (a) of FIG. 8, the numeric values "0.7" are assigned to the two areas near the top edge of the display panel and to the two areas near the bottom edge of the display panel, respectively. The numeric values "0.7" indicate heat generation on the power supply path under image display in the display area.

The section (a) of FIG. 9 shows temperature setting data used for the simulation. The temperature setting data in FIG. 9 simulates that a very bright image is displayed in the center area of the display panel. The numeric values "0.5" are assigned as the temperature data on an area in which the very bright image is displayed.

In the simulation model shown in the section (a) of FIG. 9, the numeric values "0.7" are assigned to the four areas near the top edge of the display panel and the four areas near the bottom edge of display panel, respectively. In addition, the numeric values "0.7" are assigned to the two areas near the right edge of the display panel and the two areas near the left edge of the display panel, respectively. The numeric values "0.7" indicate heat generation on the power supply path under image display in the display area.

Each of the sections (b) of FIGS. 8 and 9 is an isothermal diagram of a temperature distribution without attachment of a metal foil sheet. Each of the sections (c) of FIGS. 8 and 9 is an isothermal diagram of a temperature distribution with attachment of a metal foil sheet.

These isothermal diagrams are depicted by isothermal lines drawn at "0.5° C." intervals. In the center area of each of the isothermal diagrams (i.e. an area corresponding to the center area of the display panel to which the numeric values "0.5" are assigned), a high temperature region is recorded. The isothermal diagrams indicate that a temperature decreases as a distance from the center area (high temperature region) increases.

Under the conditions without attachment of a metal foil sheet, the isothermal diagrams have a steep gradient. In the isothermal diagram shown in the section (b) of FIG. 8, a temperature difference is "6.9° C." between the highest and lowest temperature regions. In the isothermal diagram shown in the section (b) of FIG. 9, a temperature difference is "5.7° C." between the highest and lowest temperature regions.

Under the conditions with attachment of a metal foil sheet, the isothermal diagrams have a gentle gradient. In the isothermal diagram shown in the section (c) of FIG. 8, a temperature difference is "4.7° C." between the highest and lowest temperature regions. In the isothermal diagram shown in the section (c) of FIG. 9, a temperature difference is "3.0° C." between the highest and lowest temperature regions. It is figured out from these results that a metal foil sheet contributes to moderating a local temperature increase on the display panel. As a result of the moderate local temperature increase, a local change in luminous efficiency is less likely to happen to the display panel.

In addition, it is figured out under comparison between the maximum temperatures between the sections (b) and (c) that a metal foil sheet may decrease the highest temperature generated on the display panel. This means that the metal foil sheet may suppress a change in luminous efficiency of the display panel.

Second Embodiment

Figure 10:
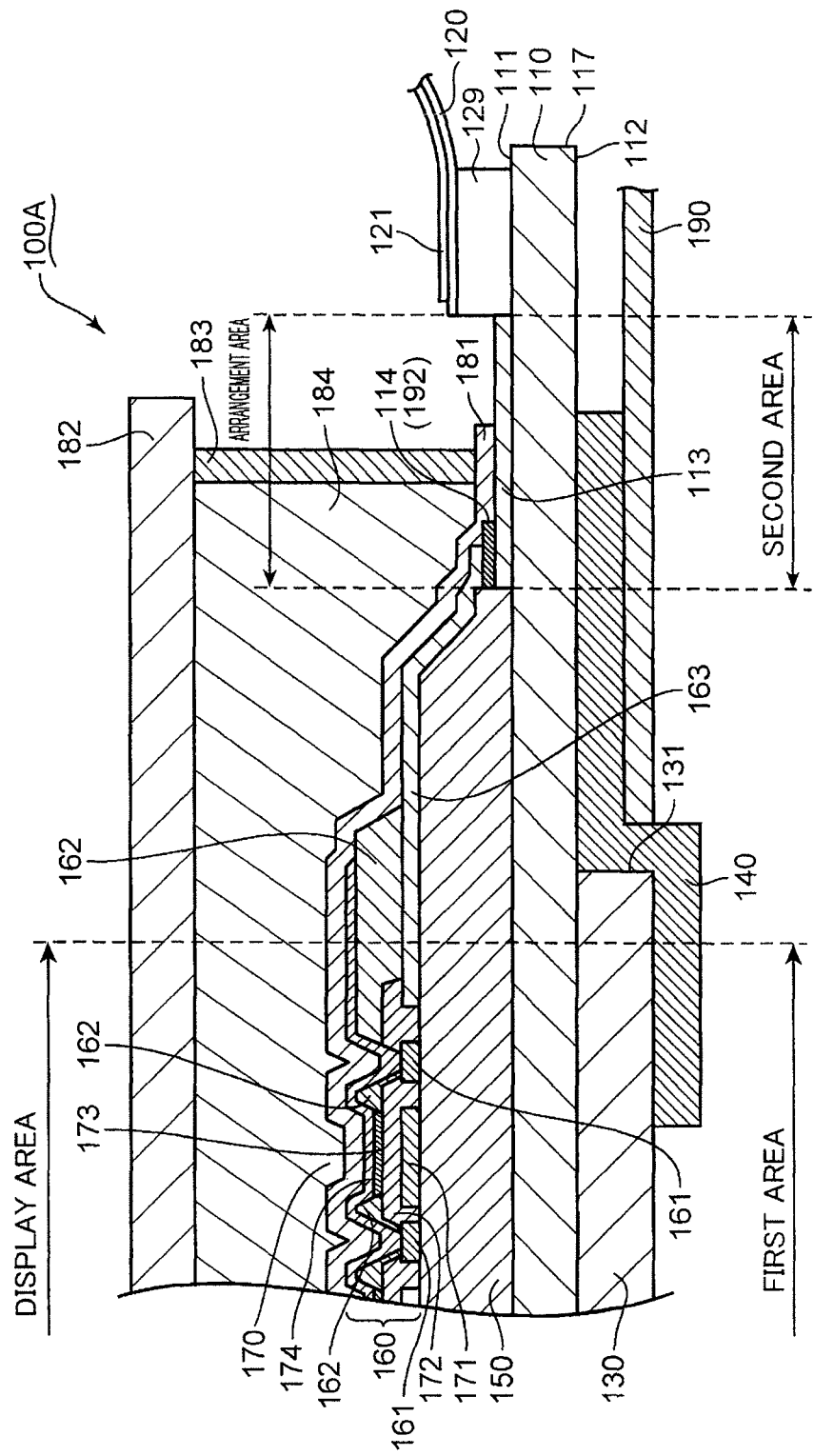
FIG. 10 is a schematic partial cross-sectional view of a display panel according to the second embodiment.

FIG. 10 is a schematic partial cross-sectional view of the display panel 100A according to the second embodiment. The display panel 100A is described with reference to FIG. 10. The same components as those of the display panel 100 of the first embodiment are denoted with the same reference symbols. Description about the same components as the first embodiment is omitted. Only differences from the display panel 100 of the first embodiment are described.

Like the display panel 100 described in the context of the first embodiment, the display panel 100A includes the substrate 110, the graphite sheet 130, the metal foil sheet 140, the TFT layer 150, the EL layer 160, the sealing thin film 181, the sealing substrate 182, the seal member 183 and the sealing portion 184. The display panel 100A further includes a heat sink 190 attached to the metal foil sheet 140.

As described in the context of the first embodiment, heat generated on the power supply path to the display area is transferred to the metal foil sheet 140. The metal foil sheet 140 isotropically conducts the transferred heat. Accordingly, the heat generated on the power supply path is suitably transferred to the heat sink 190 via the metal foil sheet 140.

It is preferable that the heat sink 190 has thermal conductivity higher than the metal foil sheet 140 does. Consequently, the heat sink 190 may conduct heat isotropically and quickly to facilitate thermal dissipation.

<Display Device>

Figure 11:
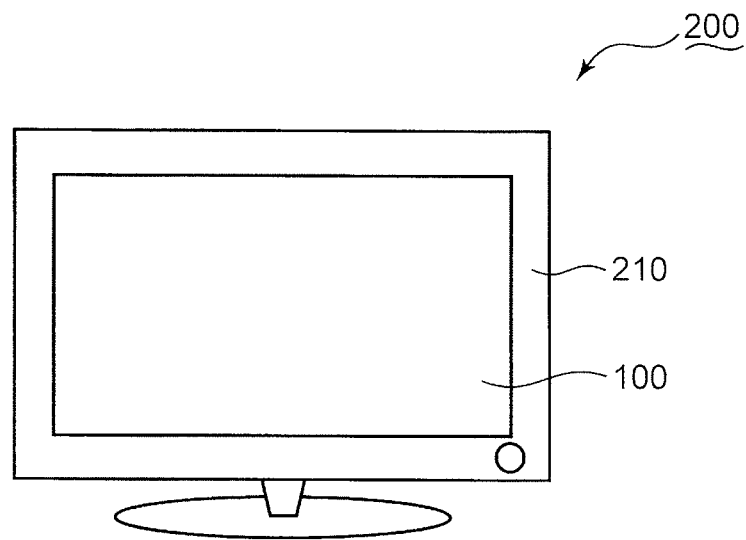
FIG. 11 is a schematic front view of a display device equipped with the display panel shown in FIG. 1.

FIG. 11 is a schematic front view of the display device 200. The display device 200 is described with reference to FIG. 11.

The display device 200 includes the display panel 100 described in the context of the first embodiment, and a housing 210 configured to store the display panel 100.

Figure 12:
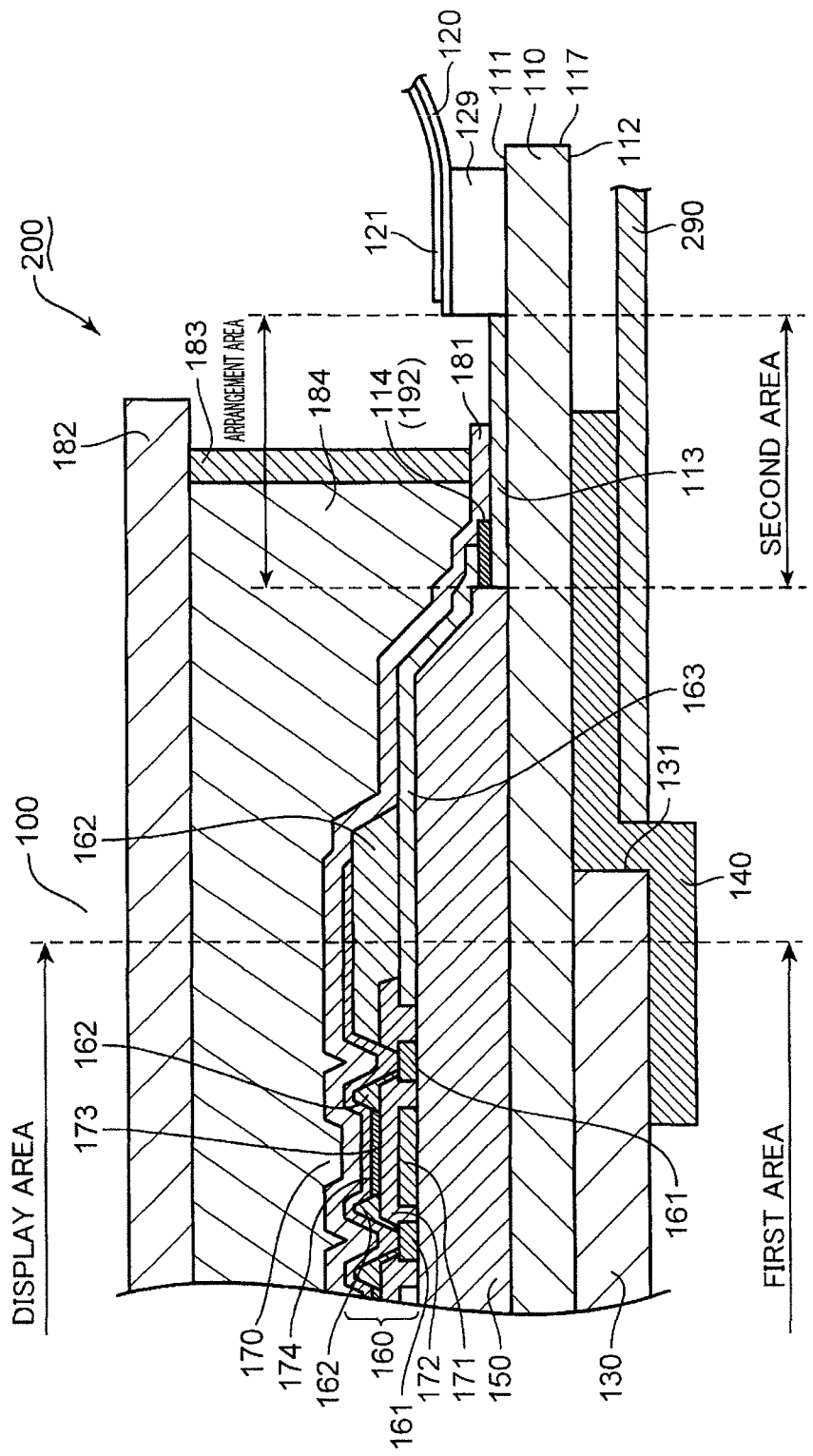
FIG. 12 is a schematic partial cross-sectional view of the display device shown in FIG. 11.
Figure 13:
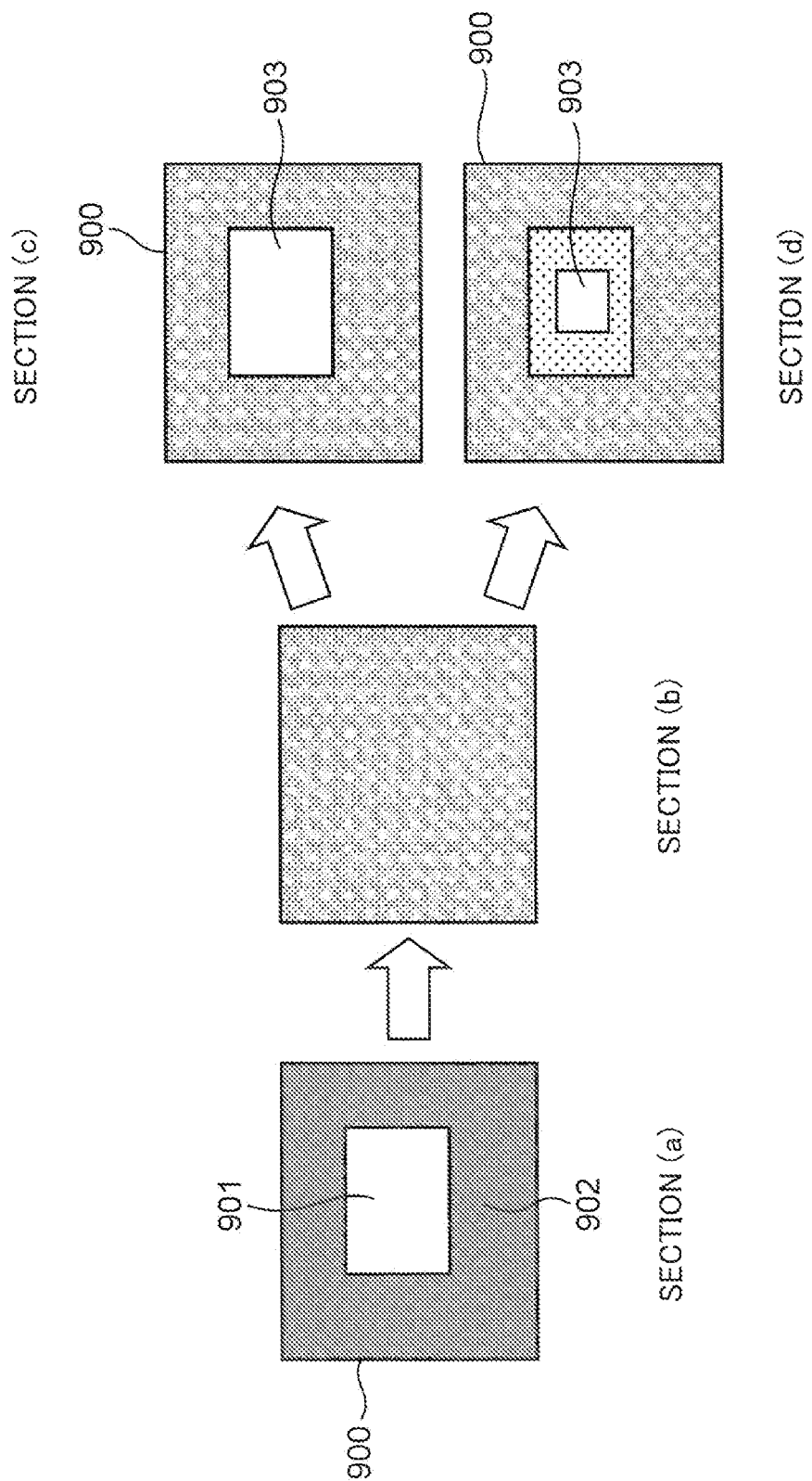
FIG. 13 is a schematic view showing effects of a radiator on images displayed on a display panel with organic EL elements.

FIG. 12 is a schematic partial cross-sectional view of the display device 200. The display device 200 is described with reference to FIGS. 11 and 12.

The display device 200 includes a heat sink 290 connected to the metal foil sheet 140. Like the heat sink 190 described in the context of the second embodiment, it is preferable that the heat sink 290 has thermal conductivity higher than the metal foil sheet 140 does. The heat sink 290 is used not only for thermal radiation from the display panel 100 but also for a chassis to support the display panel 100 in the housing 210. The heat sink 290 may be integrated with the housing 210.

Since one member (heat sink 290) has both the radiation function and the fixation function for the display panel 100, the display device 200 becomes compact, slim and light. There may be a decreased parts count of the display device 200.

The aforementioned embodiments mainly include the following features. Display panels and display devices having the following features may become less susceptible to heat generated on power supply paths for a display area which displays images.

A display panel according to one aspect of the aforementioned embodiments includes: flexible substrates on which first power lines are mounted to supply power; a substrate including a first surface provided with a display area, which has display pixels arranged to display images, a second surface opposite to the first surface, and second power lines configured to connect the first power lines to the display pixels; a thermal conduction member configured to partially cover the second surface and conduct heat in an in-plane direction; and a thermal conduction seal configured to cover a periphery of the thermal conduction member. The first surface includes an arrangement area to arrange the second power lines between the flexible substrates and the display area. The second surface includes a first area opposite to the display area and a second area opposite to the arrangement area. The thermal conduction member covers at least the first area. The thermal conduction seal covers the second area.

According to the aforementioned configuration, the first power lines are mounted on the flexible substrates to supply power. The display area with the display pixels arranged to display images is situated on the first surface of the substrate. The second power lines of the substrate connect the first power lines to the display pixels. Accordingly, images are displayed on the display area.

The thermal conduction member partially covers the second surface opposite to the first surface, and conducts heat in the in-plane direction. The thermal conduction seal covers the periphery of the thermal conduction member. Therefore, there may be little exfoliation of the thermal conduction member under deterioration of the thermal conduction member.

The first surface includes an arrangement area to arrange the second power lines between the flexible substrates and the display area. The second surface includes a first area opposite to the display area and the second area opposite to the arrangement area. The thermal conduction member covers at least the first area, so that heat generated in the display area is conducted through the thermal conduction member in the in-plane direction, and then appropriately radiated. The thermal conduction seal covers the second area, so that heat generated in the arrangement area is appropriately radiated through the thermal conduction seal. Accordingly, there becomes little thermal conduction to the first area. Therefore, there is little transmission of heat, which is generated on the power supply path, to the display pixels in the display area.

In the aforementioned configuration, the flexible substrates may preferably include a first flexible substrate attached to the first surface, and a second flexible substrate attached to the first surface, the second flexible substrate may be distant from the first flexible substrate. A power line space between the second power lines connected to the first power lines of the first flexible substrate and the second power lines connected to the first power lines of the second flexible substrate may taper toward the display area. The first surface may include a vicinity area in which the power line space becomes minimized. The second area may include an opposite area opposite to the vicinity area. The thermal conduction seal covers at least the opposite area.

According to the aforementioned configuration, the flexible substrates-include the first flexible substrate attached to the first surface, and the second flexible substrate attached to the first substrate. The second flexible is distant from the first flexible substrate. A power line space between the second power lines connected to the first power lines of the first and second flexible substrates tapers toward the display area. Since the power line space becomes minimized in the vicinity area on the first surface, heat is likely to accumulate in the vicinity area. However, the heat generated in the vicinity area is appropriately radiated through the thermal conduction seal since the thermal conduction seal covers the opposite area opposite to the vicinity area. Therefore, the display area becomes less susceptible to heat generated on the power supply path.

In the aforementioned configuration, the display area may preferably include an EL layer in which organic EL elements are formed, and a TFT layer in which TFTs are formed to drive the organic EL elements. The second power lines arranged between the flexible substrates and the display area may be formed on an identical layer to the TFT layer. The EL layer may include a power supply portion configured to supply the power from the second power lines to the organic EL elements. The power supply portion may be connected to the second power lines in the vicinity area.

According to the aforementioned configuration, the display area includes the EL layer, in which the organic EL elements are formed, and the TFT layer in which TFTs are formed to drive the organic EL elements. The second power lines are formed between the flexible substrates and the display area on the same layer as the TFT layer. The EL layer includes a power supply portion configured to supply power from the second power lines to the organic EL elements. Since the power supply portion is connected to the second power lines in the vicinity area, heat is likely to accumulate in a boundary between the power supply portion and the second power lines. However, the heat generated in the vicinity area is appropriately radiated through the thermal conduction seal since the thermal conduction seal covers at least the opposite area. Therefore, the display area becomes less susceptible to the heat generated on the power supply path.

According to the aforementioned configuration, the display panel may preferably include a heat sink connected to the thermal conduction seal.

According to the aforementioned configuration, the display panel further includes the heat sink connected to the thermal conduction seal. Therefore, heat transferred to the thermal conduction seal is appropriately radiated through the heat sink. Consequently, the display area becomes less susceptible to the heat generated on the power supply path.

In the aforementioned configuration, the heat sink may preferably have higher thermal conductivity than the thermal conduction member may.

According to the aforementioned configuration, since the heat sink may preferably have higher thermal conductivity than the thermal conduction member may, heat transferred to the thermal conduction seal is appropriately radiated through the heat sink. Consequently, the display area becomes less susceptible to the heat generated on the power supply path.

A display device according to another aspect of the embodiments includes: the aforementioned display panel; a housing configured to store the display panel; and a heat sink connected to the thermal conduction seal. The heat sink is used as a chassis to fix the display panel to the housing.

In the aforementioned configuration, the display device includes the aforementioned display panel, the housing configured to store the display panel, and the heat sink connected to the thermal conduction seal. Since the heat sink is used as a chassis to fix the display panel to the housing, it is unnecessary to provide a member for heat radiation and a member for fixing the display panel separately. Therefore, there may be a reduced parts count of the display device so that the display panel may be compact, slim and light.

Industrial Applicability

The principles of the aforementioned embodiments may be suitably applied to display panels such as organic EL display panels and PDPs, and display devices which use the display panels to display images.

The invention claimed is:

1. A display panel, comprising:
flexible substrates on which first power lines are mounted to supply power;
a substrate including a first surface provided with a display area, which has display pixels arranged to display images, a second surface opposite to the first surface, and second power lines configured to connect the first power lines to the display pixels;
a thermal conduction member configured to partially cover the second surface and conduct heat in an in-plane direction; and
a thermal conduction seal, which selectively covers a periphery of the thermal conduction member so that the thermal conduction member is exposed in an area surrounded by the thermal conduction seal, wherein
the first surface includes an arrangement area to arrange the second power lines between the flexible substrates and the display area,
the second surface includes a first area opposite to the display area and a second area opposite to the arrangement area,
the thermal conduction member covers at least the first area, and
the thermal conduction seal covers the second area.

2. The display panel according to claim 1, wherein
the flexible substrates includes a first flexible substrate attached to the first surface, and a second flexible substrate attached to the first surface, the second flexible substrate being distant from the first flexible substrate,
a power line space between the second power lines connected to the first power lines of the first flexible substrate and the second power lines connected to the first power lines of the second flexible substrate tapers toward the display area,
the first surface includes a vicinity area in which the power line space becomes minimized,
the second area includes an opposite area opposite to the vicinity area, and
the thermal conduction seal covers at least the opposite area.

3. The display panel according to claim 2, wherein
the display area includes an EL layer in which organic EL elements are formed, and a TFT layer in which TFTs are formed to drive the organic EL elements,
the second power lines arranged between the flexible substrates and the display area are formed on an identical layer to the TFT layer,
the EL layer includes a power supply portion configured to supply the power from the second power lines to the organic EL elements, and
the power supply portion is connected to the second power lines in the vicinity area.

4. The display panel according to claim 1, further comprising:
a heat sink connected to the thermal conduction seal.

5. The display panel according to claim 4, wherein
the heat sink has higher isotropic thermal conductivity than the thermal conduction seal does.

6. A display device, comprising:
the display panel according to claim 1;
a housing configured to store the display panel; and
a heat sink connected to the thermal conduction seal, wherein
the heat sink is used as a chassis to fix the display panel to the housing.

* * * * *